(12) United States Patent
Kim et al.

(10) Patent No.: US 9,112,045 B2
(45) Date of Patent: Aug. 18, 2015

(54) NONVOLATILE MEMORY DEVICE AND FABRICATING METHOD THEREOF

(71) Applicants: Ju-Hyung Kim, Gyeonggi-do (KR); Chang-Seok Kang, Gyeonggi-do (KR); Woon-Kyung Lee, Gyeonggi-do (KR)

(72) Inventors: Ju-Hyung Kim, Gyeonggi-do (KR); Chang-Seok Kang, Gyeonggi-do (KR); Woon-Kyung Lee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 150 days.

(21) Appl. No.: 13/775,833

(22) Filed: Feb. 25, 2013

(65) Prior Publication Data

US 2013/0228849 A1    Sep. 5, 2013

(30) Foreign Application Priority Data

Mar. 5, 2012 (KR) .................. 10-2012-0022466

(51) Int. Cl.
| | |
|---|---|
| *H01L 29/792* | (2006.01) |
| *H01L 29/66* | (2006.01) |
| *H01L 29/423* | (2006.01) |
| *H01L 29/51* | (2006.01) |
| *H01L 27/115* | (2006.01) |

(52) U.S. Cl.
CPC ........ *H01L 29/792* (2013.01); *H01L 27/11582* (2013.01); *H01L 29/4234* (2013.01); *H01L 29/513* (2013.01); *H01L 29/66833* (2013.01); *H01L 29/7926* (2013.01)

(58) Field of Classification Search
USPC .......................................... 257/324; 438/268
See application file for complete search history.

(56) References Cited

U.S. PATENT DOCUMENTS

| | | | |
|---|---|---|---|
| 2009/0212351 | A1 | 8/2009 | Chen |
| 2010/0117141 | A1 | 5/2010 | Shin et al. |
| 2010/0178755 | A1 | 7/2010 | Lee et al. |
| 2010/0181610 | A1 | 7/2010 | Kim et al. |
| 2010/0219392 | A1 | 9/2010 | Awaya et al. |
| 2010/0320528 | A1 | 12/2010 | Jeong et al. |
| 2011/0045657 | A1 | 2/2011 | Kim et al. |

FOREIGN PATENT DOCUMENTS

| | | |
|---|---|---|
| JP | 2009-272513 | 11/2009 |
| KR | 1020060077639 | 7/2006 |
| KR | 100786707 | 12/2007 |
| KR | 1020100054004 | 5/2010 |
| KR | 1020110034816 | 4/2011 |
| KR | 1020110042526 | 4/2011 |
| KR | 1020110064551 | 6/2011 |

*Primary Examiner* — Marvin Payen
(74) *Attorney, Agent, or Firm* — F. Chau & Associates, LLP

(57) ABSTRACT

A nonvolatile memory device comprises a channel pattern, a first interlayer dielectric film and a second interlayer dielectric film spaced apart from each other and stacked over each other, a gate pattern disposed between the first interlayer dielectric film and the second interlayer dielectric film, a trap layer disposed between the gate pattern and the channel pattern and a charge spreading inhibition layer disposed between the channel pattern and the first interlayer dielectric film and between the channel pattern and the second interlayer dielectric film. The charge spreading inhibition layer may include charges inside or on its surface. The charge spreading inhibition layer includes at least one of a metal oxide film or a metal nitride film or a metal oxynitride film having a greater dielectric constant than a silicon oxide film.

24 Claims, 13 Drawing Sheets

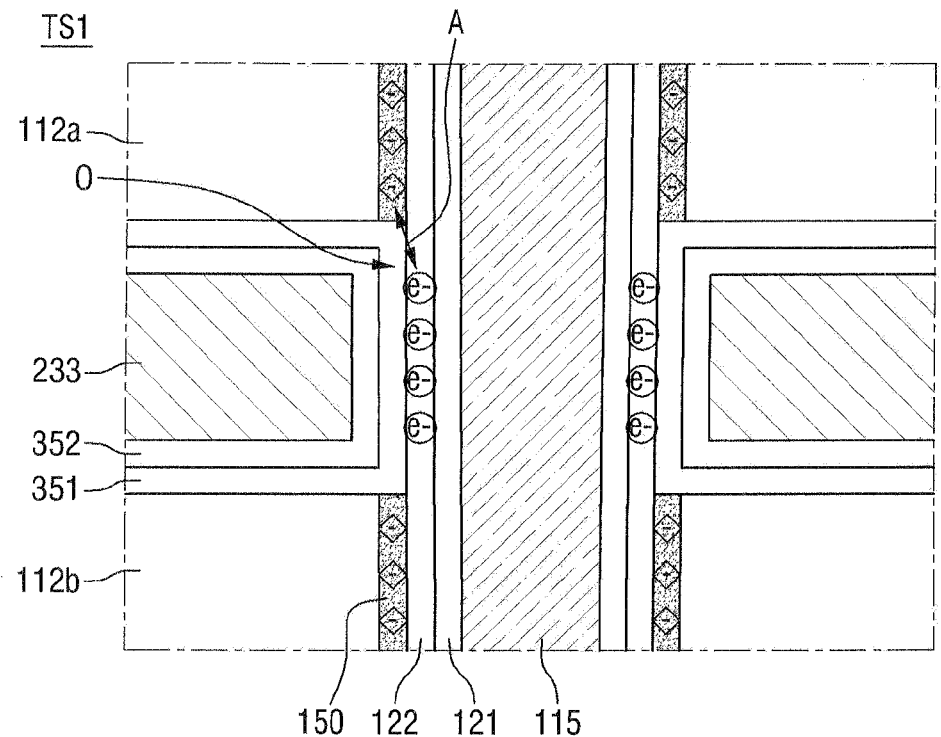
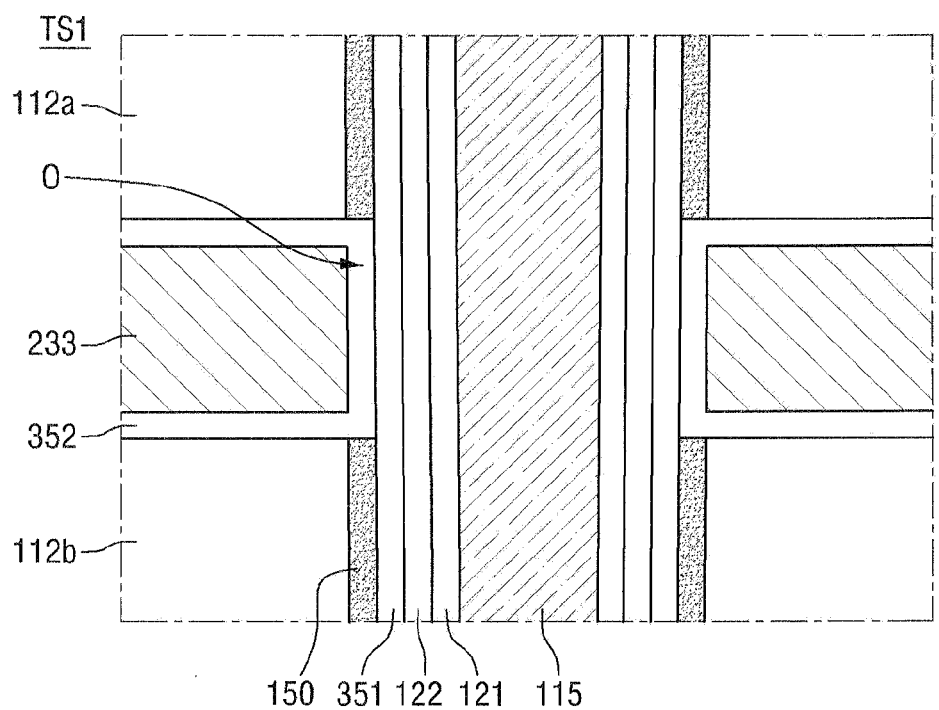

NONVOLATILE MEMORY DEVICE AND FABRICATING METHOD THEREOF

CROSS-REFERENCE TO RELATED APPLICATION

This application claims priority under 35 U.S.C. 119 from Korean Patent Application No. 10-2012-0022466 filed on Mar. 5, 2012 in the Korean Intellectual Property Office, the contents of which in its entirety are herein incorporated by reference in its entirety.

TECHNICAL FIELD

The present inventive concept relates to a nonvolatile memory device and a fabricating method thereof, and more particularly to a three-dimensional (3D) flash memory device and a fabricating method thereof.

DISCUSSION OF THE RELATED ART

With the continued demand on high performance and low cost nonvolatile memory devices, three-dimensional (3D) nonvolatile memory devices are developed. The memory nonvolatile memory devices may have floating-gate-type cells. As the integration density of semiconductor devices increases, it becomes more difficult to scale down and pattern cells because trapped charges spread out, resulting in data disturbance.

SUMMARY

In one embodiment, a nonvolatile memory device comprises a channel pattern, a first interlayer dielectric film and a second interlayer dielectric film spaced apart from each other and stacked over each other, a gate pattern disposed between the first interlayer dielectric film and the second interlayer dielectric film, a trap layer disposed between the gate pattern and the channel pattern and a charge spreading inhibition layer disposed between the channel pattern and the first interlayer dielectric film and between the channel pattern and the second interlayer dielectric film. The charge spreading inhibition layer may include charges inside or on its surface. The charge spreading inhibition layer includes at least one of a metal oxide film or a metal nitride film or a metal oxynitride film having a greater dielectric constant than a silicon oxide film.

In another embodiment, the nonvolatile memory device further comprises a tunnel layer disposed on the channel pattern and the trap layer disposed on the tunnel layer. The charge spreading inhibition layer is disposed on the trap layer. The nonvolatile memory device further comprises a block layer disposed between the first interlayer dielectric film and the gate pattern, between the second interlayer dielectric film and the gate pattern, and between the trap layer and the gate pattern. The nonvolatile memory device further comprises a block layer disposed on the trap layer, wherein the charge spreading inhibition layer is disposed on the block layer, contacting the gate pattern.

In another embodiment, the nonvolatile memory device further comprises a first block layer disposed on the trap layer. The nonvolatile memory device further comprises a second block layer disposed between the first interlayer dielectric film and the gate pattern, between the second interlayer dielectric film and the gate pattern, and between the first block layer and the gate pattern, wherein the charge spreading inhibition layer is disposed on the first block layer, contacting the second block layer.

In another embodiment, the charge spreading inhibition layer further has a portion disposed on the gate pattern.

In another embodiment, the charge spreading inhibition layer includes discontinuous multiple patterns disposed on the charge trap layer.

In one embodiment, a method of fabricating a nonvolatile memory device comprises forming interlayer dielectric films and sacrificial layers alternatively on a substrate, forming a first trench and a second trench by removing a portion of the interlayer dielectric films and the sacrificial layers, forming charge spreading inhibition layers on sidewalls of the first trench and the second trench, respectively, forming charge trap layers on the charge spreading inhibition layers, respectively, wherein the charge spreading inhibition layers include negative fixed charges, preventing trapped chares of the charge trap layers from spreading out, forming tunnel layers formed on the charge trap layers, respectively, forming channel patterns on the tunnel layers, respectively, forming a third trench by removing a portion of the interlayer dielectric films and the sacrificial layers, wherein the portion locates between the first trench and the second trench, removing the sacrificial layers and a portion of the charge spreading inhibition layers under the sacrificial layers, exposing a portion of the charge trap layer. The forming charge spreading inhibition layers includes forming a dielectric layer on sidewalls of the first trench and the second trench, respectively, wherein the dielectric layer has higher dielectric constant than a silicon oxide, and annealing the dielectric layer under an atmosphere of NH3.

In another embodiment, the method further comprises forming a blocking layer on the portion of the charge trap layer, and forming gate patterns on the blocking layers. The forming a blocking layer includes forming a first blocking layer on the portion of the charge trap layer and forming a second blocking layer on the first blocking layer. The dielectric layer includes at least one of metal oxide, metal nitride and metal oxynitride.

In one embodiment, a nonvolatile memory device comprises a channel pattern, a first tunnel layer disposed on the channel pattern, a first charge trap layer disposed on the tunnel layer, a first blocking layer disposed on the tunnel layer, a first gate pattern disposed on the first blocking layer, a second gate pattern disposed on the first blocking layer, and a first charge spreading inhibition layer disposed between the first gate pattern and the second gate pattern and disposed on the first charge trap layer, preventing charges of the first charge trap layer from spreading out.

In another embodiment, the nonvolatile memory device further comprises a second tunnel layer disposed on an opposite side of the channel pattern, a second charge trap layer disposed on the second tunnel layer, a second blocking layer disposed on the second charge trap layer, a third gate pattern disposed on the second blocking layer, a fourth gate pattern disposed on the second blocking layer, a second charge spreading inhibition layer disposed between the third gate pattern and the fourth gate pattern and disposed on the second charge trap layer, preventing charges of the second charge trap layer from spreading out. The first blocking layer is disposed on the first gate pattern and the second blocking layer is disposed on the second gate pattern. The nonvolatile memory device of claim 18 includes two blocking layers, wherein one is disposed on the first charge trap layer and the other is disposed on the first gate pattern. The charge spreading inhibition layer is a dielectric layer annealed under an atmosphere of NH3 and has a higher dielectric constant than a silicon oxide.

BRIEF DESCRIPTION OF THE DRAWINGS

The above and other features and advantages of the present inventive concept will become more apparent by describing in detail preferred embodiments thereof with reference to the attached drawings in which:

FIG. 5 shows charge distribution for illustrating the operating principle of the nonvolatile memory device shown in FIG. 1;

FIG. 6 is a cross-sectional view for illustrating a nonvolatile memory device according to a second embodiment of the present inventive concept;

DETAILED DESCRIPTION OF THE EMBODIMENTS

Figure 1:
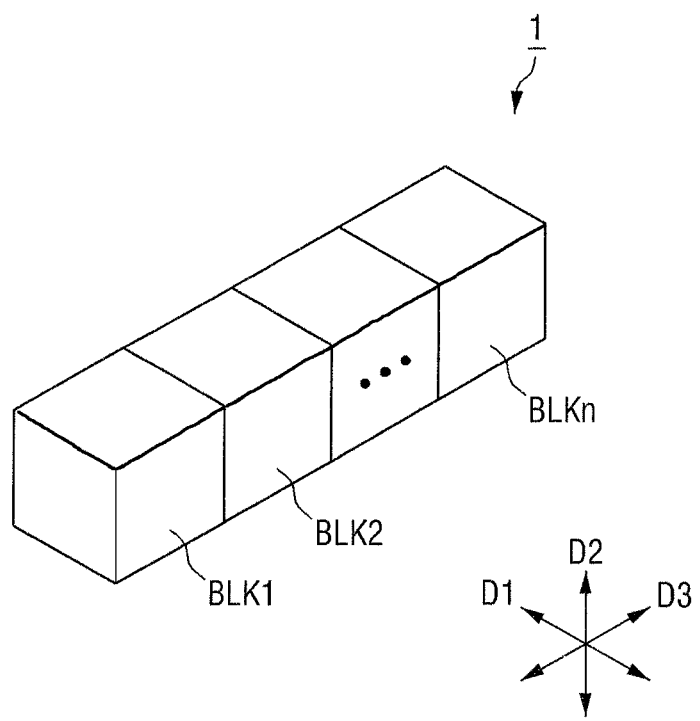
FIG. 1 is a diagram for illustrating block configuration of a nonvolatile memory device according to a first embodiment of the present inventive concept.

The present inventive concept will now be described more fully hereinafter with reference to the accompanying drawings. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will be described with reference to perspective views, cross-sectional views, and/or plan views of embodiments according to the inventive concept. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in a schematic form and the shapes of the regions are presented simply by way of illustration and not as a limitation.

Figure 2:
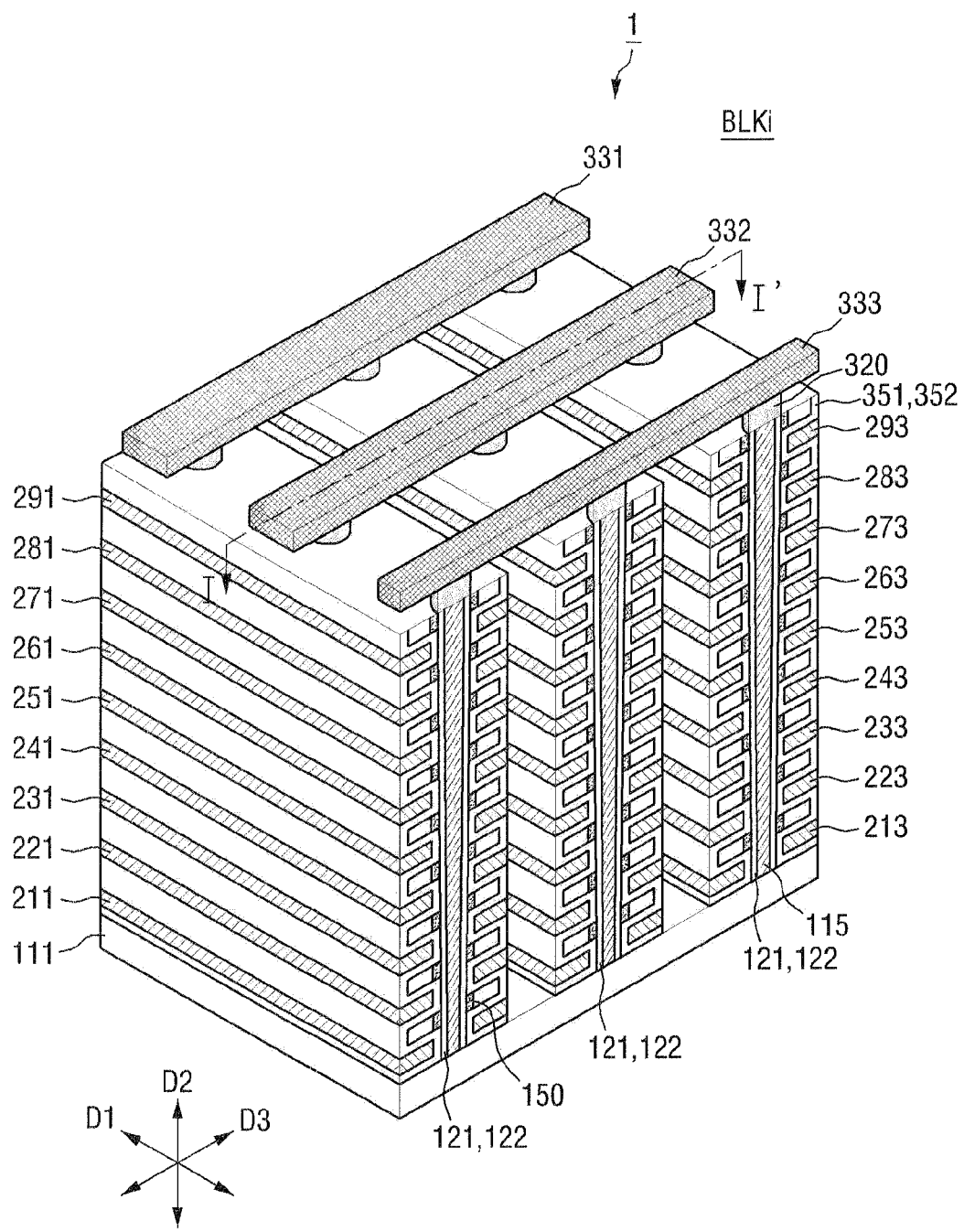
FIG. 2 is a perspective view for illustrating a memory block shown in FIG. 1.
Figure 3:
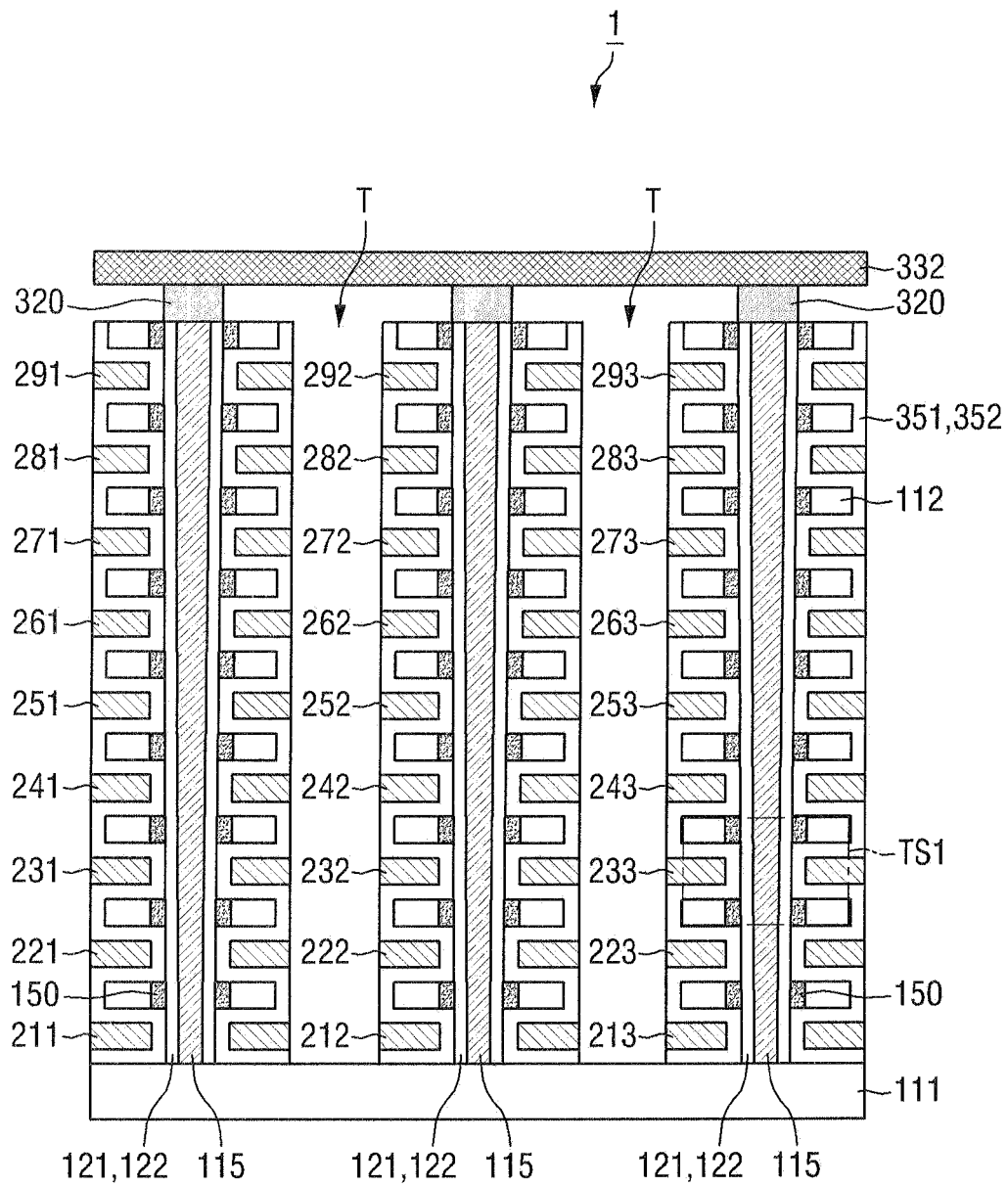
FIG. 3 is a cross-sectional view taken along the line I-I' of FIG. 2.
Figure 4:
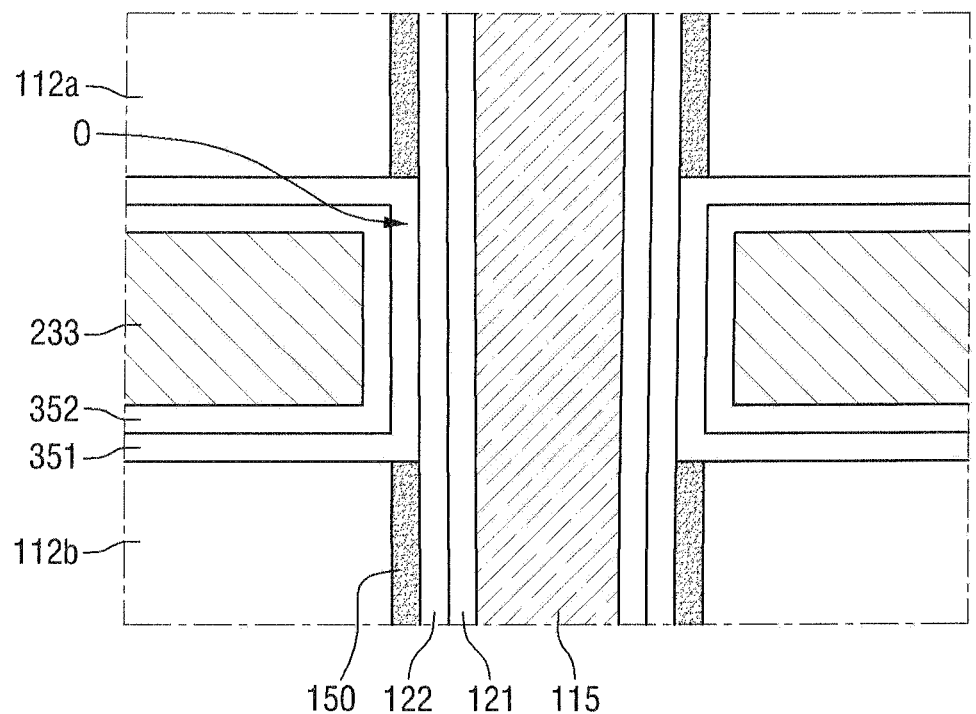
FIG. 4 is an enlarged view of a TSI region of FIG. 3.

Hereinafter, a nonvolatile memory device according to an embodiment of the present inventive concept will be described with reference to FIGS. 1 to 5. FIG. 1 is a diagram for illustrating block configuration of a nonvolatile memory device according to a first embodiment of the present inventive concept. FIG. 2 is a perspective view for illustrating a memory block of FIG. 1. FIG. 3 is a cross-sectional view taken along the line I-I' of FIG. 2. FIG. 4 is an enlarged view of a TSI region of FIG. 3. FIG. 5 illustrates the operating principle of the nonvolatile memory device of FIG. 1.

Referring to FIG. 1, a memory cell array of a nonvolatile memory device 1 according to an embodiment of the present inventive concept may include multiple memory blocks BLK1 to BLKn, where n is a natural number. The respective memory blocks BLK1 to BLKn may extend in first to third directions D1, D2 and D3. As shown in FIG. 1, the first to third directions D1, D2 and D3 are perpendicular to each other and may be different from each other. For example, the first to third directions D1, D2 and D3 may intersect each other at right angle, but aspects of the present inventive concept are not limited thereto.

Referring to FIGS. 2 to 4, the memory block BLKi, where 1≤i≤n, and i is a natural number, may include multiple interlayer dielectric films 112 formed on a substrate 111, multiple gate patterns 211 to 291, 212 to 292, and 213 to 293, multiple channel patterns 115, tunnel layers 121, trap layers 122, block layers 351 and 352, and charge spreading inhibition layers 150.

The multiple interlayer dielectric films 112 may be spaced apart from each other, sequentially being stacked on the substrate 111 in the second direction D2. As shown in FIG. 2, the multiple interlayer dielectric films 112 may be formed to extend lengthwise in the first direction D1. The interlayer dielectric films 112 may be made of oxide, but aspects of the present inventive concept are not limited thereto.

Nonvolatile memory cells TS1 of FIG. 3 may be defined at intersections of the multiple channel patterns 115 and the gate patterns 211 to 291, 212 to 292, and 213 to 293.

The multiple channel patterns 115 are formed to extend lengthwise in the second direction D2. The multiple gate patterns 211 to 291, 212 to 292 and 213 to 293 are formed to extend lengthwise in the first direction D1. In detail, the multiple channel patterns 115 are disposed on the substrate 111, having forms of pillars and penetrate the stacked multiple interlayer dielectric films 112. The multiple gate patterns 211 to 291, 212 to 292 and 213 to 293 are formed between each of the stacked multiple interlayer dielectric films 112 and are spaced apart from the multiple channel patterns 115. The multiple gate patterns 211 to 291, 212 to 292 and 213 to 293 may be formed in a direction perpendicular to the multiple channel patterns 115. In the illustrated embodiment, the multiple gate patterns 211 to 291, 212 to 292 and 213 to 293 have the same thickness. However, the multiple gate patterns 211 to 291, 212 to 292 and 213 to 293 may have different thicknesses.

The multiple channel patterns 115 may be made of, for example, a semiconductor material such as single crystalline silicon, but aspects of the present inventive concept are not limited thereto. The multiple gate patterns 211 to 291, 212 to 292 and 213 to 293 may be made of a conductive material such as tungsten (W), cobalt (Co) or nickel (Ni), or a semiconductor material such as silicon, but aspects of the present inventive concept are not limited thereto.

The tunnel layers 121 and the trap layers 122 may be formed on sidewalls of the channel patterns 115. The tunnel layers 121 and the trap layers 122 may be disposed between the gate patterns 233 and the channel patterns 115. For example, the tunnel layers 121 and the trap layers 122 may be formed along the channel patterns 115.

The tunnel layers 121 may pass through charges from the channel patterns 115 to the trap layers 122. The tunnel layers 121 may be formed of, for example, a silicon oxide film or a dual layer of a silicon oxide film and a silicon nitride film.

The trap layers 122 may store the charges passed through the tunnel layers 121. The trap layers 122 may be formed of a nitride film or a high-k film. Examples of the nitride film may include at least one of silicon nitride, silicon oxynitride, hafnium oxynitride, zirconium oxynitride, hafnium silicon oxynitride, and hafnium aluminum oxynitride. Examples of the high-k film may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In addition, block layers 351 and 352 may be disposed between the multiple channel patterns 115 and the multiple gate patterns 211 to 291, 212 to 292 and 213 to 293. The block layers 351 and 352 may be formed to extend lengthwise in the first direction D1. In addition, the block layer may be formed in a zigzag configuration in the second direction D2.

As shown in FIG. 4, the nonvolatile memory cells TS1 may have a two-layered block layer 315 and 352. The block layers 351 and 352 may be formed between the upper interlayer dielectric film 112 and the gate pattern 233, between the lower interlayer dielectric film 112b and the gate pattern 233, or between the channel pattern 115 (or the trap layer 122) and the gate pattern 233. That is to say, the block layers 351 and 352 may be conformally formed along the interlayer dielectric films 112a and 112b and the channel pattern 115.

The block layers 351 and 352 may include silicon oxide or an insulating metal oxide having a greater dielectric constant than silicon oxide. For example, the block layers 351 and 352 may be formed of a high-k material such as aluminum oxide, hafnium oxide, lanthanum oxide, tantalum oxide, titanium oxide, lanthanum hafnium oxide, lanthanum aluminum oxide, or dysprosium scandium oxide, or a complex layer having a stack of combinations of these materials. For example, the block layers 351 and 352 may include first block layers 351 made of silicon oxide and second block layers 352 made of aluminum oxide. Alternatively, the nonvolatile memory cells TS1 may have a single-layered blocking layer.

The charge spreading inhibition layers 150 may be disposed between the channel pattern 115 and each of the interlayer dielectric films 112a and 112b, respectively. In other words, the charge spreading inhibition layers 150 may be formed on the trap layers 122, contacting the blocking layer 351. The trap layers 122 and the block layers 351 may contact each other through the opening O, defining a region where the charges stored in the trap layers 122 of FIG. 5 are confined under the gate patterns 233.

The charge spreading inhibition layers 150 may include negative fixed charges inside or on its surface. The charge spreading inhibition layers 150 may include at least one of a metal oxide film, a metal nitride film and a metal oxynitride film having a greater dielectric constant than a silicon oxide film. As will be described later, a material layer including at least one of a metal oxide film, a metal nitride film, and a metal oxynitride film is formed and the material layer is then subjected to ammonia ($NH_3$) annealing, thereby forming the charge spreading inhibition layers 150. For example, the material layer may include aluminum oxide.

The charge spreading inhibition layers 150 inhibit the charges stored in the trap layers 122 of a nonvolatile memory cell from spreading laterally to another nonvolatile memory cell adjacent to the nonvolatile memory cell. In detail, when the memory cells TS1 are programmed by applying a gate bias to the gate patterns 233, the memory cells TS1 may have charges at a region under the gate patterns 233 of the trapped layers 122. However, with the passage of time, the charges may spread out when a gate bias is not applied. The charge spreading inhibition layers 150 serve to electrically inhibit the charges stored in the trap layers 122 from spreading out, which will be described in more detail, with reference to FIG. 5. In more detail, the charge spreading inhibition layers 150 include negative fixed charges, and the trap layers 122 store negative charges in a programming operation. Therefore, a repulsive force A generated between the negative fixed charges in the charge spreading inhibition layers 150 and the negative charges in the trap layers 122 may prevent the trapped charges of the trap layers 122 from spreading out. Therefore, the negative charges in the trap layers 122 may not spread out for an extended period of time after a programming operation is performed. Accordingly, the reliability of the nonvolatile memory device may be improved.

Meanwhile, as shown in FIGS. 2 and 3, the multiple channel patterns 115 may be spaced apart from each other, being arrayed in the first direction D1 and the third direction D3. That is to say, the multiple channel patterns 115 may be arrayed in a matrix configuration. For simplicity of explanation, FIGS. 2 and 3 may have the multiple channel patterns 115 arrayed in a 3×3 matrix, but aspects of the present inventive concept are not limited thereto.

A trench T may be formed in the multiple interlayer dielectric films 112 between the multiple channel patterns 115 arranged in the third direction D3. The multiple channel patterns 115 arrayed in the third direction D3 may be electrically connected to each other by bit lines 331 to 333.

FIG. 6 is a cross-sectional view for illustrating a nonvolatile memory device according to another embodiment of the present inventive concept. The following description of the nonvolatile memory device will direct on differences that the embodiment of FIG. 6 has from the embodiment of FIG. 4.

Referring to FIG. 6, the memory cells TS1 may have identical structure with that of FIG. 4 except for block layers 351. In detail, the first block layers 351 may be formed on the trap layers 122. The charge inhibiting layer may be formed on a part of the first block layers 351. In addition, second block layers 352 may be formed between the first block layers 351 and the interlayer dielectric films 112a and the gate pattern 233, between the second interlayer dielectric film 112b and the gate pattern 233, and between the first block layers 351 and the gate patterns 115. Therefore, as shown in FIG. 6, the charge spreading inhibition layers 150 may contact both of the first block layers 351 and the second block layers 352.

Figure 7:
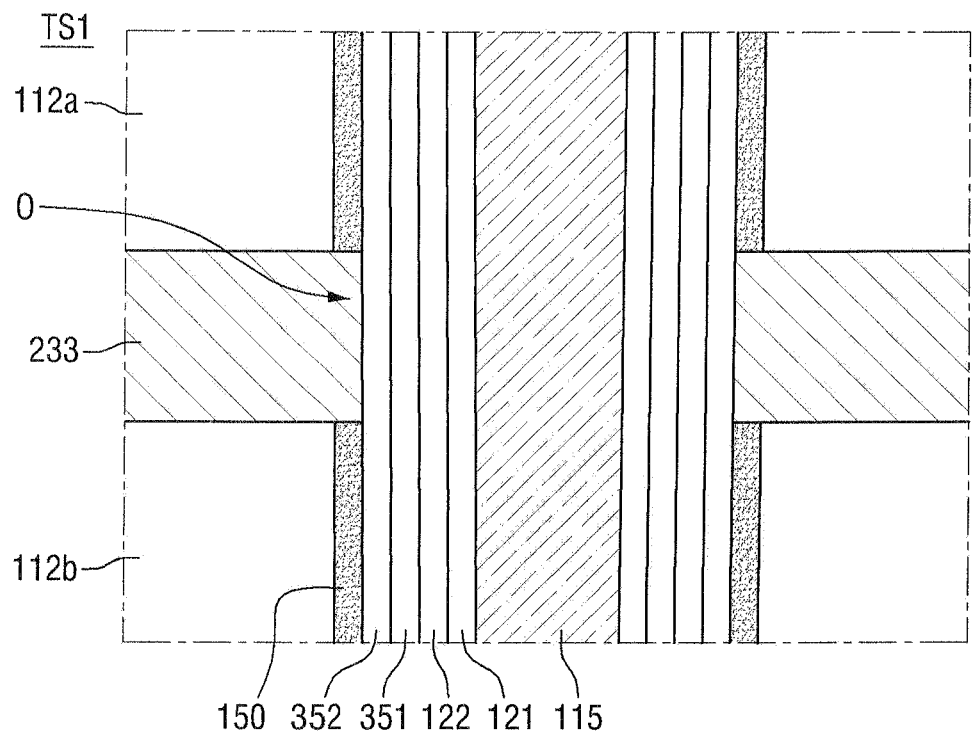
FIG. 7 is a cross-sectional view for illustrating a nonvolatile memory device according to a third embodiment of the present inventive concept.

FIG. 7 is a cross-sectional view for illustrating a nonvolatile memory device according to another embodiment of the present inventive concept. The following description of the nonvolatile memory device will direct on differences that the embodiment of FIG. 7 has from the embodiment of FIG. 4.

Referring to FIG. 7, the memory cells TS1 may have first block layers 351 and second block layers 352 different from those of FIG. 4.

In detail, the first block layers 351 may be formed on a channel pattern 115, and the second block layers 352 may be formed on the first block layers 351. With this configuration, the charge spreading inhibition layer 150 may contact portions of the gate patterns 233, being formed on the second block layers 352. As shown in FIG. 7, portions of top and bottom surfaces of each of the gate patterns 233 may contact the charge spreading inhibition layer 150.

Figure 8:
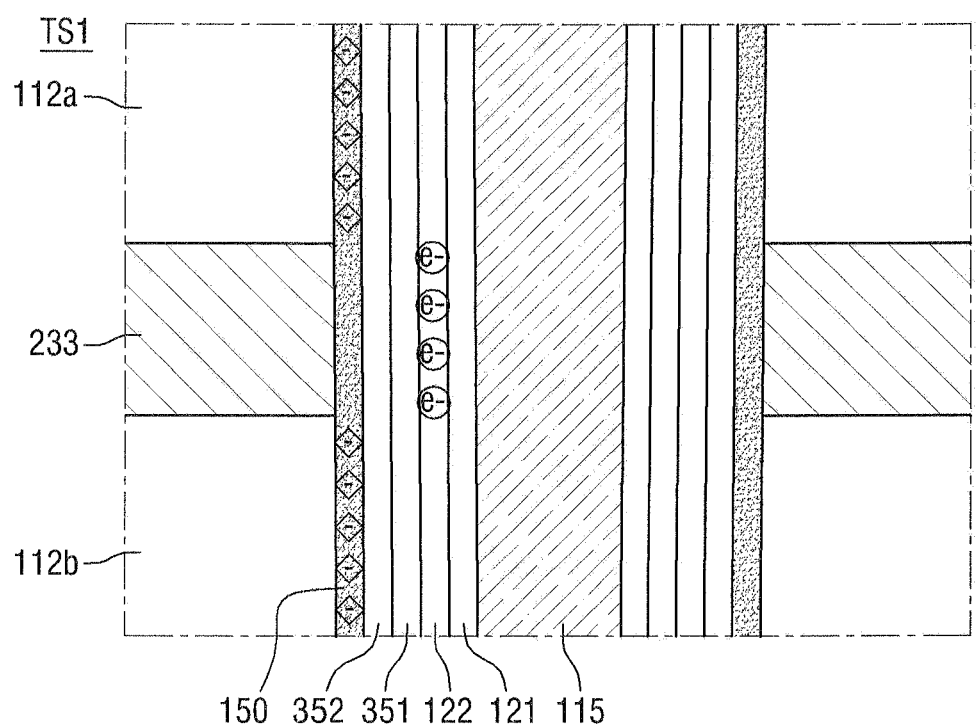
FIG. 8 is a cross-sectional view for illustrating a nonvolatile memory device according to a fourth embodiment of the present inventive concept.

FIG. 8 is a cross-sectional view for illustrating a nonvolatile memory device according to another embodiment of the present inventive concept. The following description of the nonvolatile memory device will direct on differences that the embodiment of FIG. 8 has from the embodiment of FIG. 4.

Referring to FIG. 8, the memory cells TS1 may include a charge spreading inhibition layer 150 formed under a gate pattern 233. That is to say, the opening O of FIG. 4 is not formed at an intersection of a gate pattern 233 and a channel pattern 115.

The memory cells TS1 may have a charge spreading inhibition layer 150. The charge spreading inhibition layer 150 may include at least one of HfO and $ZrO_2$. If HfO or $ZrO_2$ is formed on an interlayer dielectric film 112, negative fixed charges may be included inside or on a surface of HfO or $ZrO_2$. As shown in FIG. 8, the negative fixed charges are generated only at portions of the charge spreading inhibition layer 150 contacting interlayer dielectric films 112a and 112b.

The memory cells TS1 may have a two layered structure 351 and 352. The two layered block layer 351 and 352 may be interposed between the charge spreading inhibition layer 150 and a trap layer 122.

Figure 9:
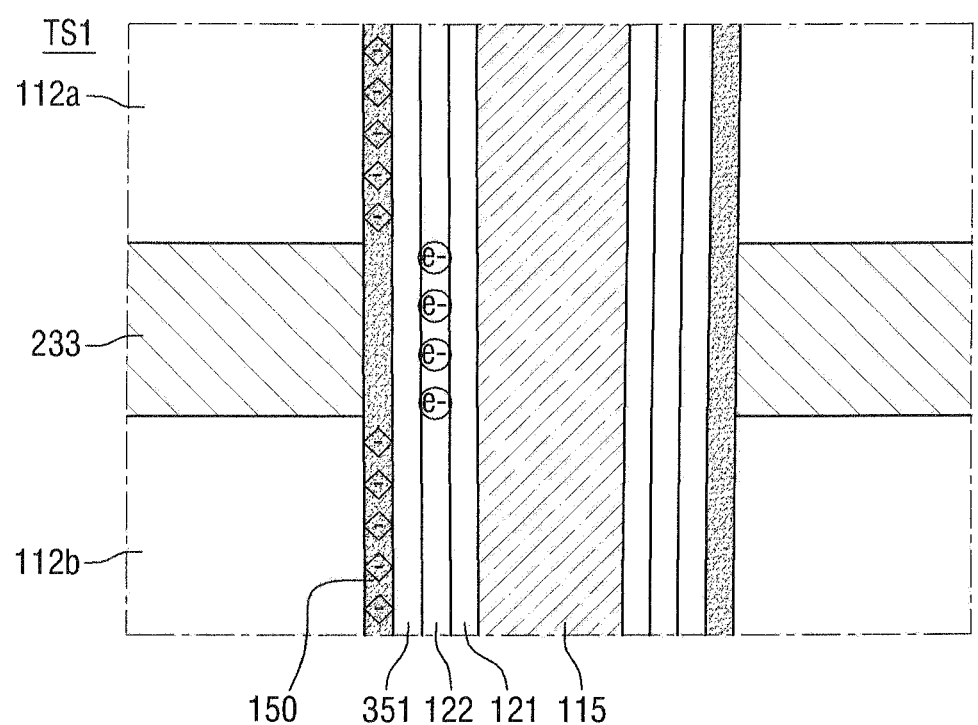
FIG. 9 is a cross-sectional view for illustrating a nonvolatile memory device according to a fifth embodiment of the present inventive concept.

FIG. 9 is a cross-sectional view for illustrating a nonvolatile memory device according to another embodiment of the present inventive concept. The following description of the nonvolatile memory device will direct on differences that the embodiment of FIG. 9 has from the embodiment of FIG. 4.

Referring to FIG. 9, the memory cells TS1 may have a block layer 351 consisting of a single layer interposed between the charge spreading inhibition layer 150 and a trap layer 122.

Figure 10:
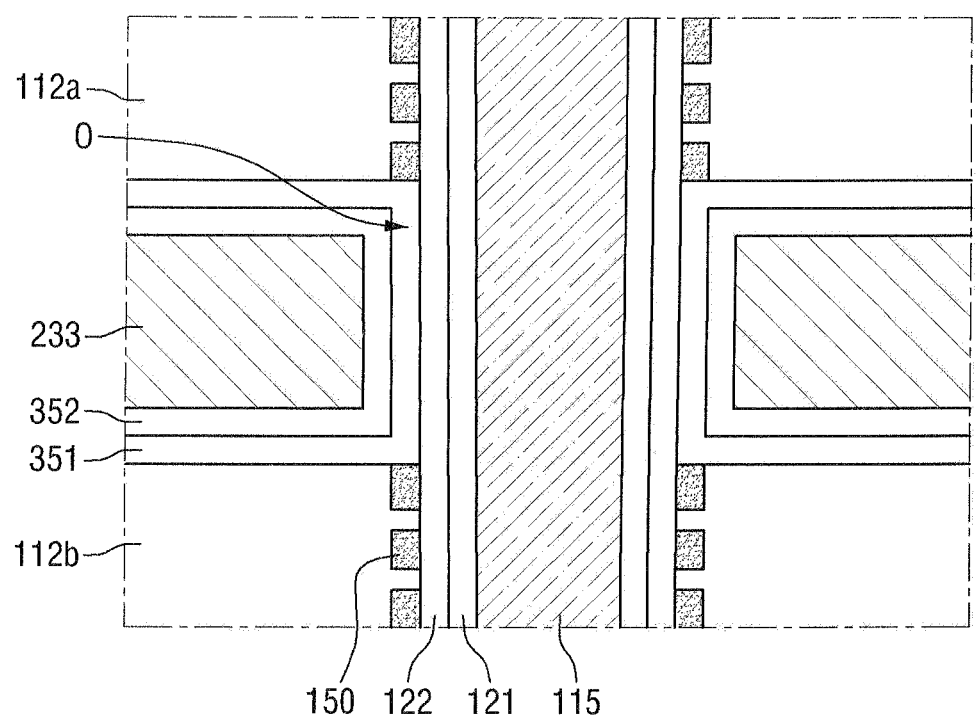
FIG. 10 is a cross-sectional view for illustrating a nonvolatile memory device according to a sixth embodiment of the present inventive concept.

FIG. 10 is a cross-sectional view for illustrating a nonvolatile memory device according another embodiment of the present inventive concept. The following description of the nonvolatile memory device will direct on differences that the embodiment of FIG. 10 has from the embodiment of FIG. 4.

Referring to FIG. 10, the nonvolatile device may include charge spreading inhibition layers 150 formed on a charge trap layer 122 in discontinuous multiple patterns. That is to say, while the charge spreading inhibition layer 150 shown in FIG. 4 is formed continuously on a charge trap layer 122, the charge spreading inhibition layer 150 shown in FIG. 10 is formed on a charge trap layer 122 in a discontinuous way. The charge spreading inhibition layer 150 includes negative fixed charges inside or on its surface, resulting in preventing the charges stored in the trap layer 122 from spreading out.

Hereinafter, a fabricating method of the nonvolatile memory of FIG. 4 device according to an embodiment of the present inventive concept will be described with reference to FIGS. 11 to 16. FIGS. 11 to 16 illustrate process steps for explaining a fabricating method of the nonvolatile memory device of FIG. 4.

Figure 11:
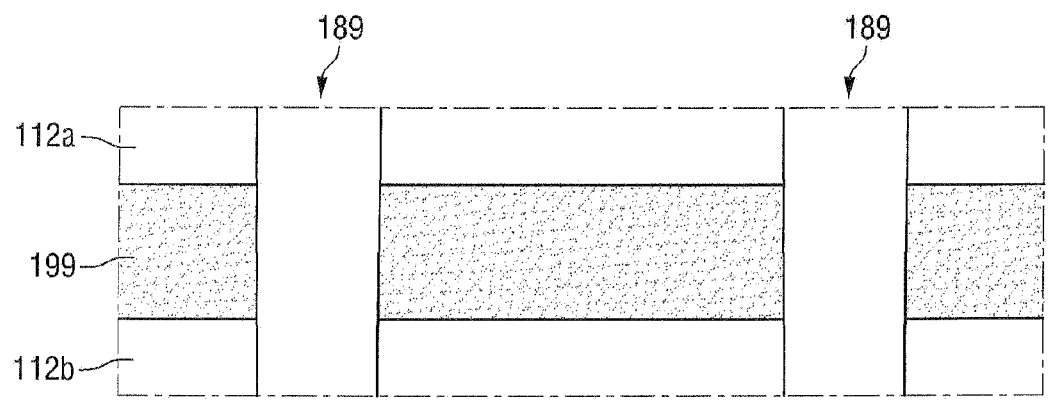
FIGS. 11 to 16 are process steps for illustrating a fabricating method of the nonvolatile memory device according to the first embodiment of the present inventive concept.

Referring to FIG. 11, sacrificial films 199 and interlayer dielectric films 112a and 112b are alternately formed over each other. Here, the sacrificial films 199 may have a different etch rate from that of the interlayer dielectric films 112a and 112b. For example, the sacrificial films 199 may be nitride films and the interlayer dielectric films 112a and 112b may be oxide films.

Next, through holes 189 are formed. The through holes 189 may penetrate the sacrificial films 199 and the multi-layered interlayer dielectric films 112a and 112b.

Figure 12:
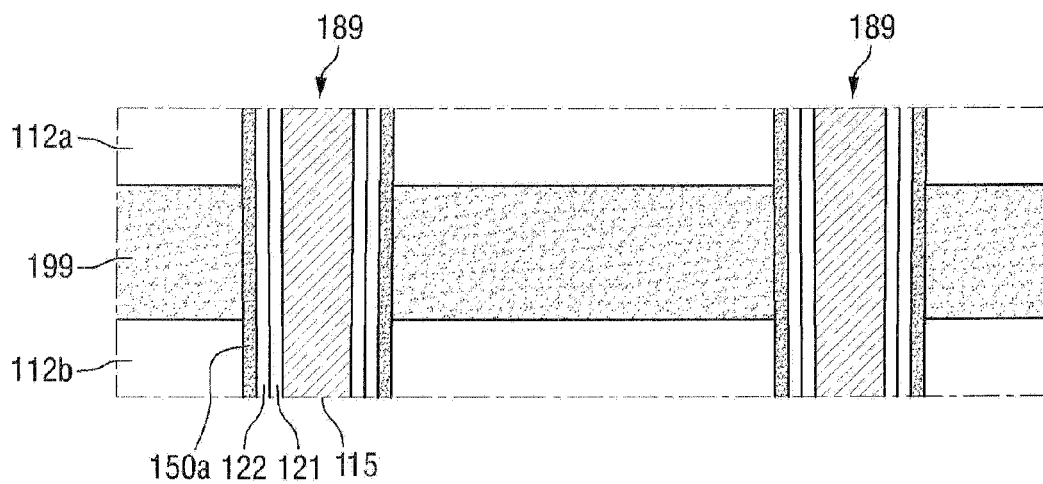

Referring to FIG. 12, charge spreading inhibition layers 150a are formed on sidewalls of the through holes 189. In detail, a dielectric layer including at least one of metal oxide or metal nitride or metal oxynitride may be formed, and then the dielectric layer may be subjected to an annealing process under the atmosphere of ammonia ($NH_3$), thereby forming the charge spreading inhibition layers 150a. The dielectric layer may have a greater dielectric constant than silicon oxide. For example, the dielectric layer may include aluminum oxide.

Next, a trap layer 122 is formed on each of the charge spreading inhibition layers 150a. Subsequently, a tunnel layer 121 is formed on the trap layer 122.

In detail, the forming of the trap layer 122 and the tunnel layer 121 may be performed by chemical vapor deposition (CVD), physical vapor deposition (PVD) or atomic layer deposition (ALD).

Next, a channel pattern 115 is formed on the tunnel layer 121. The channel pattern 115 may be formed, filling each of the through holes 189. The channel pattern 115 may be made of single crystalline silicon. For example, the channel pattern 115 is formed in amorphous silicon, being changed to a single crystalline structure by a heat treatment process. Alternatively, the channel pattern 115 may be formed by an epitaxial growth process using a substrate 111 as a seed layer.

Figure 13:
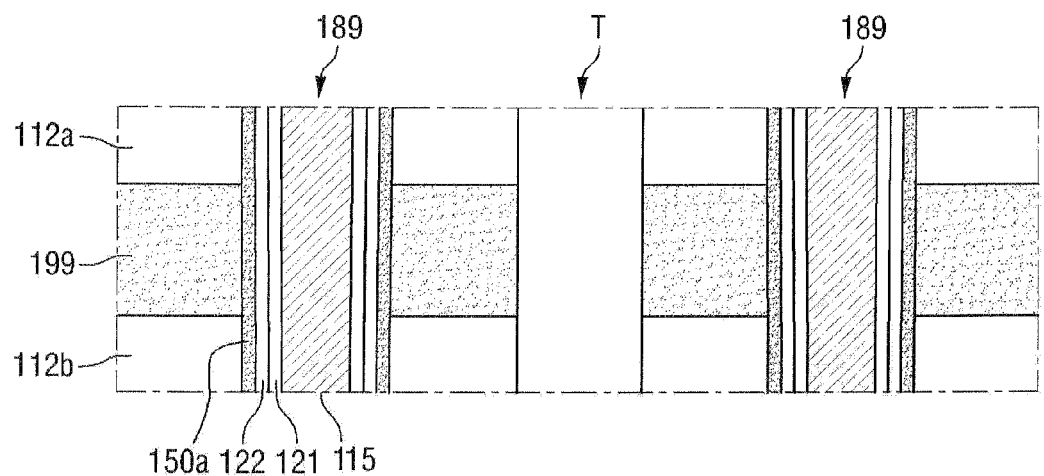

Referring to FIG. 13, the sacrificial films 199 and the interlayer dielectric films 112a and 112b are removed, thereby forming a trench T spaced apart from the channel pattern 115. The trench T may be disposed between two neighboring channel patterns 115.

Figure 14:
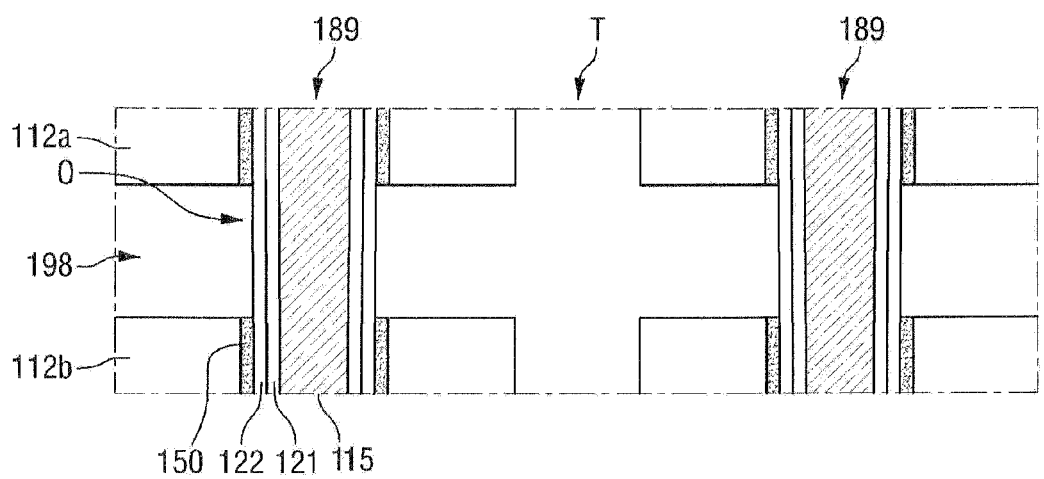

Referring to FIG. 14, the sacrificial films 199 are removed by a pull-back process, thereby forming a space 198 between the interlayer dielectric films 112a and 112b. In the pull-back process, a wet etching process may be performed using phosphoric acid, sulfuric acid, chloric acid, and mixed solutions thereof. Portions of the charge spreading inhibition layer 150 may also be removed by the pull-back process, thereby forming multiple openings O in the charge spreading inhibition layer 150. That is to say, trap layers 122 may be exposed through the openings O.

Figure 15:
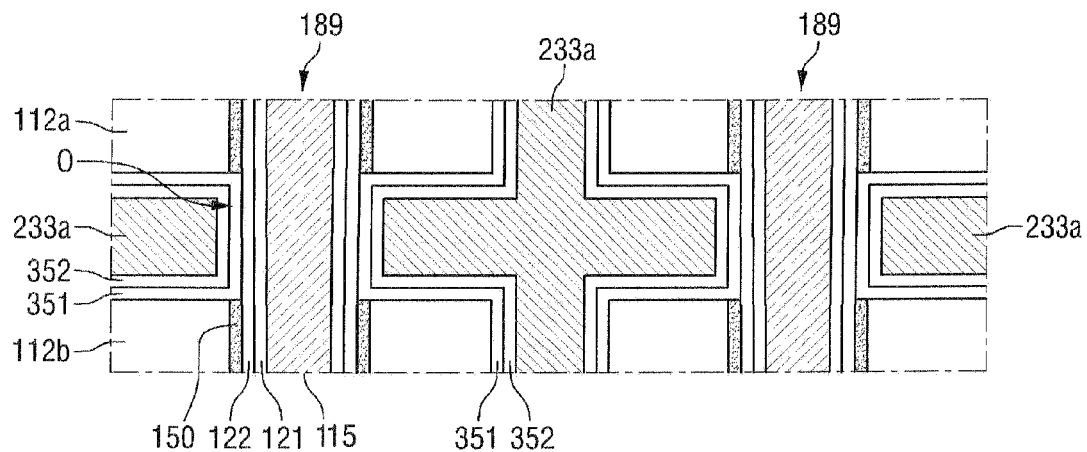

Referring to FIG. 15, block layers 351 and 352 are formed both on the charge trap layers 122 and the interlayer dielectric films 112a and 112b. In detail, the block layers 351 and 352 may be formed along top and bottom surfaces of the interlayer dielectric films 112a and 112b and portions of side surfaces of the exposed trap layers 122.

Subsequently, a conductive material 233a is formed on the block layers 351 and 352, filling the space 198.

Figure 16:
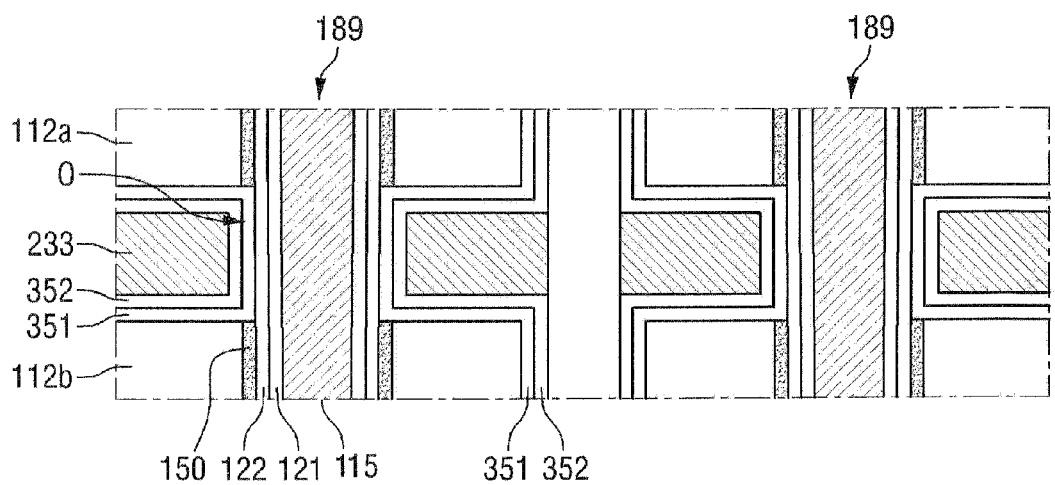

Referring to FIG. 16, a portion of the conductive material 233a is removed, thereby forming gate patterns 233.

Figure 17:
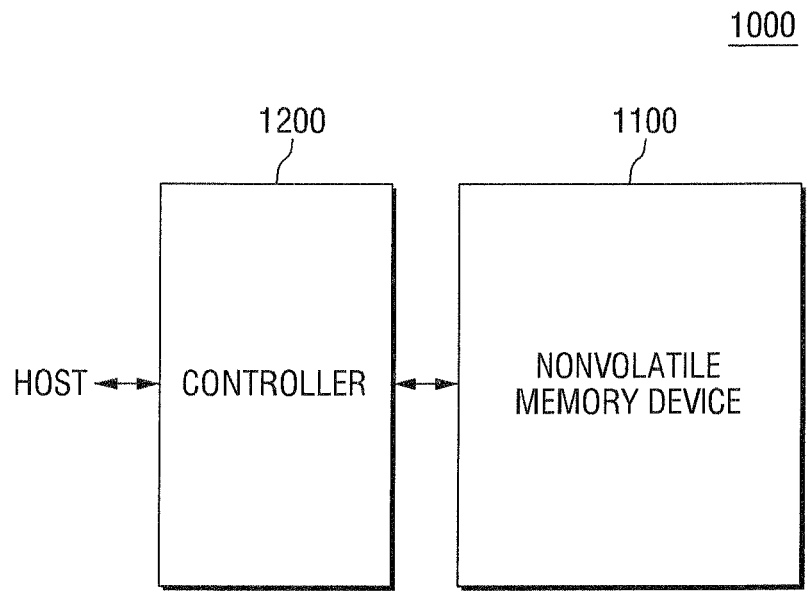
FIG. 17 is a block diagram for illustrating a memory system according to some embodiments of the present inventive concept.

FIG. 17 is a block diagram for illustrating a memory system according to some embodiments of the present inventive concept.

Referring to FIG. 17, a memory system 1000 includes a nonvolatile memory device 1100 and a controller 1200.

The nonvolatile memory device 1100 may be configured and operate in the same manner as previously described in FIGS. 1 to 10.

The controller 1200 is connected to a host and the nonvolatile memory device 1100. In response to a request from the host, the controller 1200 is configured to access the nonvolatile memory device 1100. For example, the controller 1200 is configured to control read, write, erase and background operations of the nonvolatile memory device 1100. The controller 1200 is configured to implement a protocol for interacting between the nonvolatile memory device 1100 and the host. The controller 1200 is configured to control the nonvolatile memory device 1100 based on firmware.

In an embodiment, the controller 1200 may further include a random access memory (RAM), a processing unit, a host interface, and a memory interface. The RAM is used as at least one of a working memory of the processing unit, a cache memory between the nonvolatile memory device 1100 and the host, and a buffer memory between the nonvolatile memory device 1100 and the host. The processing unit controls the overall operation of the controller 1200.

The host interface comprises a protocol for exchanging data between the host and the controller 1200. In some embodiments, the controller 1200 communicates with an external device, such as a host, via one of various interface protocols such as a universal serial bus (USB), multimedia card (MMC), peripheral component interconnect express (PCI-E), advanced technology attachment (ATA), serial-ATA, parallel-ATA, small computer system interface (SCSI), enhanced small disk interface (ESDI), and integrated drive electronics (IDE). The memory interface typically implements a protocol for interacting with nonvolatile memory device 1100. For example, the memory interface includes an NAND interface or a NOR interface.

The memory system 1000 may further comprise an ECC block. The ECC block is configured to detect and correct errors of data read from nonvolatile memory device 1100. In an exemplary embodiment, the ECC block is provided as a constituent of the controller 1200. The ECC block may be provided as a constituent of the nonvolatile memory device 1100.

The controller 1200 and the nonvolatile memory device 1100 are integrated to form one semiconductor device. In one embodiment, the controller 1200 and the nonvolatile memory device 1100 are integrated to form a memory card. For example, the controller 1200, the nonvolatile memory device 1100, and a cache memory (not shown) may be integrated to form a PCMCIA card, a compact flash (CF) card, a Smart-Media Card (SM/SMC), a memory stick, a multimedia card (MMC), a reduced-size multimedia card (RS-MMC), an MMCmicro card, a secure digital (SD) card, a miniSD card, a microSD card, or a universal flash storage (UFS) card.

Alternatively, the controller 1200 and the nonvolatile memory device 1100 may be integrated to form a solid state drive/disk (SSD). Using the memory system 10 as an SSD can greatly improve the operating speed of a device connected with a memory system 1000.

In other embodiments, the memory system 1000 is implemented in a computer, a portable computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a 3-dimensional television, a digital audio recorder/player, digital picture/video recorder/player, a device capable of transmitting and receiving information via wireless communication, one of various electronic devices constituting a home network, one of various electronic devices constituting a computer network, one of various electronic devices constituting a telematics network, RFID, or one of various electronic devices constituting a computing system.

In an exemplary embodiment, the nonvolatile memory device 1100 or the memory system 1000 may be packed by various packages such as PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

Figure 18:
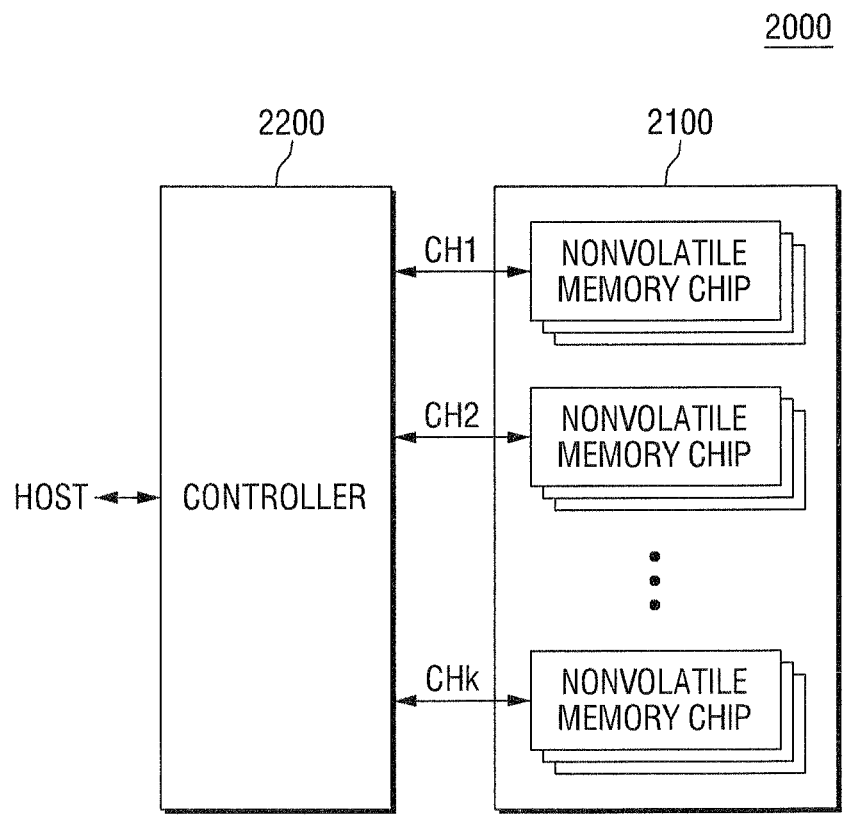
FIG. 18 is a block diagram for illustrating one possible application for the memory system of FIG. 17.

FIG. 18 is a block diagram illustrating one possible application for the memory system of FIG. 17. Referring to FIG. 18, a memory system 2000 comprises a nonvolatile memory device 2100 and a controller 2200. The nonvolatile memory device 2100 may be implemented using a plurality of nonvolatile memory chips, which are divided into a plurality of groups. The nonvolatile memory chips in each group may be configured to communicate with the controller 2200 via one common channel. In FIG. 18, for example, the plurality of nonvolatile memory chips communicates with the controller 2200 via a plurality of channels CH1 to CHk.

Each of the nonvolatile memory chips may be configured in the same manner as the nonvolatile memory device 100 previously described with reference to FIGS. 1 to 10.

FIG. 18 describes that a plurality of nonvolatile memory chips are connected to a single channel. However, it will be understood that the memory system 2000 may be modified such that a single nonvolatile memory chip may be connected to a single channel.

Figure 19:
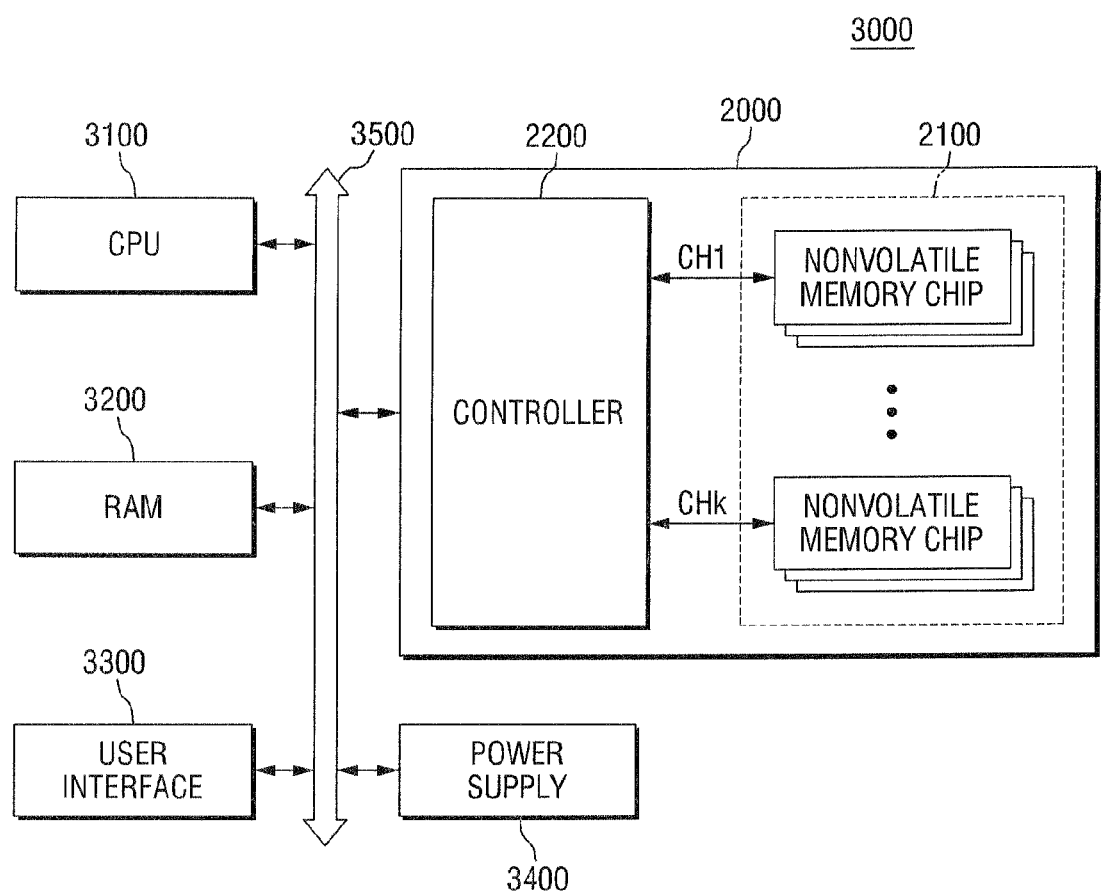
FIG. 19 is a block diagram for illustrating a computing system including the memory system of FIG. 18.

FIG. 19 is a block diagram illustrating a computing system including the memory system of FIG. 18. Referring to FIG. 19, the computing system 3000 in accordance with example embodiments includes a central process unit (CPU) 3100, a random access memory (RAM) 3200, a user interface 3300, a power supply 3400 and a memory system 2000.

The memory system 2000 is electrically connected to the central process unit (CPU) 3100, the random access memory (RAM) 3200, the user interface 3300, and the power supply 3400 through a system bus 3500. Data provided through the user interface 3300 or processed by the central process unit (CPU) 3100 is stored in the memory system 2000.

FIG. 19 describes that a nonvolatile memory device 2100 is connected to a system bus 3500 through a controller 2200. However, the nonvolatile memory device 2100 may be configured to be directly connected to the system bus 3500.

In FIG. 19, the same memory system as the memory system 2000 shown in FIG. 18 is provided. However, the memory system 2000 may also be replaced by the memory system 1000 shown in FIG. 17.

In an example embodiment, the computing system 3000 may be configured to include both of the memory systems 1000 and 2000 shown in FIGS. 17 and 18.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A nonvolatile memory device comprising:
   a channel pattern;
   a first interlayer dielectric film and a second interlayer dielectric film spaced apart from each other and stacked over each other;
   a gate pattern disposed between the first interlayer dielectric film and the second interlayer dielectric film;
   a trap layer disposed between the gate pattern and the channel pattern;
   a charge spreading inhibition layer disposed between the channel pattern and the first interlayer dielectric film, and between the channel pattern and the second interlayer dielectric film;
   a first block layer disposed on the trap layer; and
   a second block layer disposed between the first interlayer dielectric film and the gate pattern, between the second interlayer dielectric film and the gate pattern, and between the first block layer and the gate pattern,
   wherein the charge spreading inhibition layer is disposed on the first block layer, contacting the second block layer.

2. The nonvolatile memory device of claim 1 further comprising a tunnel layer disposed on the channel pattern and the trap layer disposed on the tunnel layer.

3. The nonvolatile memory device of claim 2, wherein the charge spreading inhibition layer is disposed on the trap layer.

4. The nonvolatile memory device of claim 2 wherein the charge spreading inhibition layer further has a portion disposed on the gate pattern.

5. The nonvolatile memory device of claim 1, wherein the charge spreading inhibition layer includes discontinuous multiple patterns formed on the charge trap layer.

6. The nonvolatile memory device of claim 1, wherein the charge spreading inhibition layer include charges inside or on its surface.

7. The nonvolatile memory device of claim 1, wherein the charge spreading inhibition layer includes at least one of a metal oxide film or a metal nitride film or a metal oxynitride film having a greater dielectric constant than a silicon oxide film.

8. A method of fabricating a nonvolatile memory device comprising:
   forming interlayer dielectric films and sacrificial layers alternatively on a substrate;
   forming a first trench and a second trench by removing a portion of the interlayer dielectric films and the sacrificial layers;
   forming charge spreading inhibition layers on sidewalls of the first trench and the second trench, respectively;
   forming charge trap layers on the charge spreading inhibition layers, respectively, wherein the charge spreading inhibition layers include negative fixed charges, preventing trapped chares of the charge trap layers from spreading out;
   forming tunnel layers formed on the charge trap layers, respectively;
   forming channel patterns on the tunnel layers, respectively;
   forming a third trench by removing a portion of the interlayer dielectric films and the sacrificial layers, wherein the portion locates between the first trench and the second trench; and
   removing the sacrificial layers and a portion of the charge spreading inhibition layers under the sacrificial layers, exposing a portion of the charge trap layer.

9. The method of claim 8 further comprising:
   forming a blocking layer on the portion of the charge trap layer; and
   forming gate patterns on the blocking layer;

10. The method of claim 9, wherein the forming of the blocking layer includes:
    forming a first blocking layer on the portion of the charge trap layer; and
    forming a second blocking layer on the first blocking layer.

11. The method of claim 8, wherein the forming of the charge spreading inhibition layers includes:
    forming a dielectric layer on the sidewalls of the first trench and the second trench, respectively, wherein the dielectric layer has a higher dielectric constant than a silicon oxide; and
    annealing the dielectric layer under an atmosphere of NH3.

12. The method of claim 11, wherein the dielectric layer includes at least one of metal oxide, metal nitride and metal oxynitride.

13. A nonvolatile memory device comprising:
    a channel pattern;
    a first tunnel layer disposed on the channel pattern;
    a first charge trap layer disposed on the first tunnel layer;
    a first blocking layer disposed on the first tunnel layer;

a first gate pattern disposed on the first blocking layer;
a second gate pattern disposed on the first blocking layer; and
a first charge spreading inhibition layer disposed between the first gate pattern and the second gate pattern and disposed on the first charge trap layer, preventing charges of the first charge trap layer from spreading out.

14. The nonvolatile memory device of claim 13 further comprising:
a second tunnel layer disposed on an opposite side of the channel pattern;
a second charge trap layer disposed on the second tunnel layer;
a second blocking layer disposed on the second charge trap layer;
a third gate pattern disposed on the second blocking layer;
a fourth gate pattern disposed on the second blocking layer;
a second charge spreading inhibition layer disposed between the third gate pattern and the fourth gate pattern and disposed on the second charge trap layer, preventing charges of the second charge trap layer from spreading out.

15. The nonvolatile memory device of claim 14, wherein the first blocking layer is disposed on the first gate pattern and the second blocking layer is disposed on the second gate pattern.

16. The nonvolatile memory device of claim 15, wherein the first blocking layer includes two blocking layers, wherein one is disposed on the first charge trap layer and the other is disposed on the first gate pattern.

17. The nonvolatile memory device of claim 13, wherein the first charge spreading inhibition layer is a dielectric layer annealed under an atmosphere of NH3 and has a higher dielectric constant than a silicon oxide.

18. A nonvolatile memory device comprising:
a channel pattern;
a first interlayer dielectric film and a second interlayer dielectric film spaced apart from each other and stacked over each other;
a gate pattern disposed between the first interlayer dielectric film and the second interlayer dielectric film;
a trap layer disposed between the gate pattern and the channel pattern; and
a charge spreading inhibition layer disposed between the channel pattern and the first interlayer dielectric film, and between the channel pattern and the second interlayer dielectric film.

19. The nonvolatile memory device of claim 18 further comprising:
a tunnel layer disposed on the channel pattern and the trap layer disposed on the tunnel layer.

20. The nonvolatile memory device of claim 19, wherein the charge spreading inhibition layer is disposed on the trap layer.

21. The nonvolatile memory device of claim 19, wherein the charge spreading inhibition layer further includes a portion disposed on the gate pattern.

22. The nonvolatile memory device of claim 18, wherein the charge spreading inhibition layer includes discontinuous multiple patterns formed on the charge trap layer.

23. The nonvolatile memory device of claim 18, wherein the charge spreading inhibition layer includes charges inside or on its surface.

24. The nonvolatile memory device of claim 18, wherein the charge spreading inhibition layer includes at least one of a metal oxide film, a metal nitride film and a metal oxynitride film having a greater dielectric constant than a silicon oxide film.

* * * * *